(12) United States Patent
Suh

(10) Patent No.: US 8,232,654 B2
(45) Date of Patent: Jul. 31, 2012

(54) SEMICONDUCTOR PACKAGE THROUGH-ELECTRODE SUITABLE FOR A STACKED SEMICONDUCTOR PACKAGE AND SEMICONDUCTOR PACKAGE HAVING THE SAME

(75) Inventor: Min Suk Suh, Seoul (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 53 days.

(21) Appl. No.: 13/089,666

(22) Filed: Apr. 19, 2011

(65) Prior Publication Data

US 2011/0198722 A1    Aug. 18, 2011

Related U.S. Application Data

(62) Division of application No. 11/856,149, filed on Sep. 17, 2007, now Pat. No. 7,973,414.

(30) Foreign Application Priority Data

Aug. 16, 2007 (KR) ......................... 10-2007-0082437

(51) Int. Cl.
   - H01L 23/48 (2006.01)
   - H01L 23/52 (2006.01)
   - H01L 29/40 (2006.01)

(52) U.S. Cl. .................. 257/774; 257/777; 257/E23.145

(58) Field of Classification Search .................. 257/777, 257/774, E23.145
See application file for complete search history.

(56) References Cited

U.S. PATENT DOCUMENTS

| | | | |
|---|---|---|---|
| 6,809,421 B1 * | 10/2004 | Hayasaka et al. | ............ 257/777 |
| 6,897,148 B2 | 5/2005 | Halahan et al. | |
| 7,176,128 B2 | 2/2007 | Ahrens et al. | |
| 7,446,404 B2 * | 11/2008 | Huang et al. | ................. 257/686 |
| 7,521,360 B2 | 4/2009 | Halahan et al. | |
| 7,781,892 B2 | 8/2010 | Chen et al. | |
| 2002/0084513 A1 | 7/2002 | Siniaguine | |

FOREIGN PATENT DOCUMENTS

| | | |
|---|---|---|
| CN | 1655333 A | 8/2005 |
| JP | 2001-135785 A | 5/2001 |
| KR | 1020050021078 A | 3/2005 |

(Continued)

OTHER PUBLICATIONS

USPTO OA mailed Feb. 17, 2009 in connection with U.S. Appl. No. 11/856,149.

(Continued)

*Primary Examiner* — Jenny L Wagner
(74) *Attorney, Agent, or Firm* — Ladas & Parry LLP

(57) ABSTRACT

A semiconductor package including a through-electrode for stacked a semiconductor package and a semiconductor package having the same is disclosed. The semiconductor package through-electrode includes a first electrode having a recessed portion formed therein to pass through a semiconductor chip. A second electrode is disposed within the recess of the first electrode. The first electrode of the semiconductor package through-electrode includes a first metal having a first hardness, and a second electrode comprises a second metal having a second hardness lower than the first hardness. The through-electrode passes through the semiconductor chip body and may be formed with the first metal having the first hardness and/or a first melting point and the second metal having a second hardness and/or a second melting point which are lower than the first hardness and/or the first melting point. This through-electrode allows a plurality of semiconductor packages to be easily stacked.

14 Claims, 10 Drawing Sheets

FOREIGN PATENT DOCUMENTS

| KR | 1020050122532 A | 12/2005 |
| KR | 1020070051165 A | 5/2007 |

OTHER PUBLICATIONS

USPTO OA mailed Apr. 24, 2009 in connection with U.S. Appl. No. 11/856,149.

USPTO OA mailed Oct. 19, 2009 in connection with U.S. Appl. No. 11/856,149.

USPTO OA mailed Jan. 28, 2010 in connection with U.S. Appl. No. 11/856,149.

USPTO OA mailed Jun. 17, 2010 in connection with U.S. Appl. No. 11/856,149.

USPTO OA mailed Oct. 8, 2010 in connection with U.S. Appl. No. 11/856,149.

USPTO NOA mailed Jan. 27, 2011 in connection with U.S. Appl. No. 11/856,149.

\* cited by examiner

SEMICONDUCTOR PACKAGE THROUGH-ELECTRODE SUITABLE FOR A STACKED SEMICONDUCTOR PACKAGE AND SEMICONDUCTOR PACKAGE HAVING THE SAME

CROSS-REFERENCE TO RELATED APPLICATIONS

The present application claims priority to Korean patent application number 10-2007-0082437 filed on Aug. 16, 2007, which is incorporated herein by reference in its entirety.

BACKGROUND OF THE INVENTION

The present invention relates to a semiconductor package through-electrode and a semiconductor package having the same.

A semiconductor package is generally manufactured in a three-step process including a semiconductor chip making process, an electric test process, and a packaging process. The semiconductor chip making process generates wafers consisting of devices such as transistors, registers, and capacitors. The electric test process electrically tests the semiconductor chip and classifies each chip as a good or bad semiconductor chip. The packaging process protects the fragile semiconductor chip from external attacks and/or vibrations.

The semiconductor package, including the semiconductor device, has been applied to such devices as personal computers, television receivers, consumer electronics, and information communication machines.

Advancements in semiconductor package technology have yielded a "chip scale package" that is 100% to 105% of the size of existing semiconductor chips. Advancements have also yielded a "stacked semiconductor package" improving data storage capacity and data process velocity by stacking multiple semiconductor chips and/or semiconductor packages.

The recently developed stacked semiconductor package is manufactured by forming a through-electrode on the semiconductor chip and stacking a plurality of semiconductor chips having a through-electrode.

A high melting point metal, such as copper, is generally used in forming the through-electrode formed on the semiconductor chip.

Therefore, the through-electrodes formed on adjacent semiconductor chips can be connected with each other via a low melting point metal such as a solder. The high melting point through-electrodes of the semiconductor chips are unaffected by the low melting point solder and are electrically connected to one another.

However, a gap may be generated between the stacked semiconductor chips due to the solder used to electrically connect the through-electrodes. The gap formed by the solder greatly reduces the reliability of the stacked semiconductor package.

An under-fill material may be injected between the soldered semiconductor chips in order to eliminate the reduction in reliability due to the gap formed during soldering. However, the narrow gaps of earlier stacked semiconductor packages cannot be injected with the under-fill materials.

It is possible to overcome such a problem and electrically connect the through-electrodes of the adjacent semiconductor chips directly to one another. To do so causes another problem because the through-electrodes must then be bonded at a high temperature and high pressure to directly and electrically connect the through-electrodes with each other.

BRIEF SUMMARY OF THE INVENTION

Embodiments of the present invention provide a semiconductor package through-electrode suitable for a stacked semiconductor package.

According to one embodiment of the present invention, a semiconductor package through-electrode comprises a first electrode having a recess portion formed therein to pass through a semiconductor chip; and a second electrode disposed within the recessed portion.

In the semiconductor package through-electrode, the first electrode comprises a first metal having a first hardness, and the second electrode comprises a second metal having a second hardness lower than the first hardness.

In the semiconductor package through-electrode, the first electrode comprises a first metal having a first melting point, and the second electrode comprises a second metal having a second melting point lower than the first melting point.

The first electrode of the semiconductor package through-electrode comprises any one of copper, aluminum, aluminum alloy or metal alloy.

The second electrode of the semiconductor package through-electrode comprises a solder containing lead (Pb).

The first electrode of the semiconductor package through-electrode has a length greater than a thickness of the semiconductor chip.

The first electrode of the semiconductor package through-electrode is pipe-shaped with one end blocked.

In the semiconductor package through-electrode, the first electrode has a first extension portion extended in the other end opposite to the one end, the second electrode has a second extension portion extended correspondingly to the first extension portion.

The present invention provides a semiconductor package having the through-electrode.

A semiconductor package according to the present invention comprises a semiconductor chip having a semiconductor chip body having a circuit unit and a bonding pad connected with the circuit unit; and a through-electrode having a first electrode having a recess portion formed therein and a second electrode disposed within the recess portion to pass through the bonding pad and the semiconductor chip body corresponding to the bonding pad.

In the semiconductor package, the first electrode comprises a first metal having a first hardness and the second electrode comprises a second metal having a second hardness lower than the first hardness.

In the semiconductor package, the first electrode comprises a first metal having a first melting point, and the second electrode comprises a second metal having a second melting point lower than the first melting point.

The first electrode of semiconductor package comprises any one of copper, aluminum, aluminum alloy or metal, and the second electrode comprises a solder containing lead (Pb).

The first electrode of the semiconductor package has a length greater than a thickness of the semiconductor chip body.

In the semiconductor package, the first electrode is electrically connected to the bonding pad and is pipe-shaped with one end open.

In the semiconductor package, the first electrode has a first extension portion extended in the end, and the second electrode has a second extension portion extended corresponding to the first extension portion.

The bonding pad of the semiconductor package is disposed on a center portion of a top surface of the semiconductor chip body.

The bonding pad of the semiconductor package is disposed on an edge of the top surface of the semiconductor chip body.

The semiconductor chip of the semiconductor package comprises an insulating film formed on the semiconductor chip body to cover the bonding pad, the first electrode and the second electrode.

The insulating film of the semiconductor package further comprises an opening to expose the second electrode.

The semiconductor chip body of the semiconductor package comprises a fuse for repairing the circuit unit and a fuse insulating member for covering and insulating the fuse.

The semiconductor package further comprises a connection pad connected with the through-electrode, a substrate having a solder layer disposed on the connection pad, and an under-fill member interposed between the substrate and the semiconductor chip body.

The semiconductor package according to the present invention comprises a semiconductor chip having a semiconductor chip body having a circuit unit and a bonding pad disposed on a center portion of the semiconductor chip body to be connected to the circuit unit; a through-electrode having a first electrode having a recess portion formed therein and a second electrode disposed within the recess portion to pass through an edge of the semiconductor chip body; and a re-distribution layer electrically connecting the bonding pad with the through-electrode.

In the semiconductor package, the first electrode comprises a first metal having a first hardness, and the second electrode comprises a second metal having a second hardness lower than the first hardness.

In the semiconductor package, the first electrode comprises a first metal having a first melting point, and the second electrode comprises a second metal having a second melting point lower than the first melting point.

In the semiconductor package, the first electrode comprises any one of copper, aluminum, aluminum alloy or metal, and the second electrode comprises a solder containing lead (Pb).

The first electrode of the semiconductor package has a length greater than a thickness of the semiconductor chip body.

In the semiconductor package, the first electrode has a first extension portion extended in a surface portion of the semiconductor chip body, and the second electrode has a second extension portion extended correspondingly to the first extension portion.

The semiconductor chip of the semiconductor package comprises an insulating film formed on the semiconductor chip body to cover the bonding pad, the first electrode and the second electrode.

The insulating film of the semiconductor package comprises an opening to expose the second electrode The re-distribution layer of the semiconductor package further comprises a seed metal pattern.

In the semiconductor package, a connection pattern containing the same material as that of the first electrode is disposed between the re-distribution layer and the bonding pad.

The semiconductor chip body of the semiconductor package comprises a fuse for repairing the circuit unit and a fuse insulating member for covering the fuse.

The semiconductor package further comprises a connection pad connected to the through-electrode, a substrate having a solder layer disposed on the connection pad, and an under-fill member interposed between the substrate and the semiconductor chip body.

DESCRIPTION OF SPECIFIC EMBODIMENTS

Figure 1:
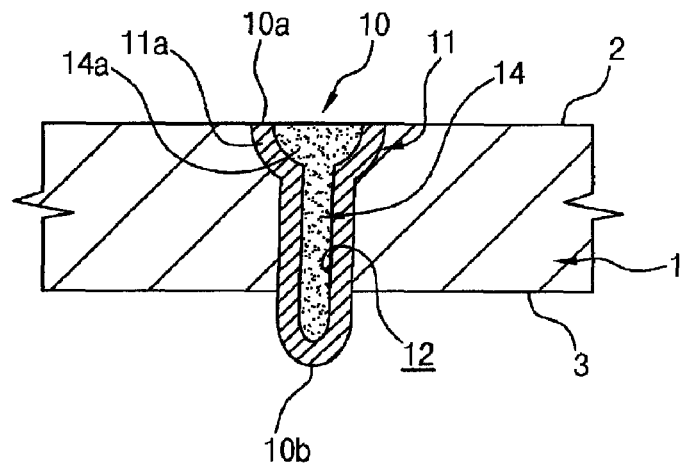
FIG. 1 is a cross-sectional view illustrating a semiconductor package through-electrode according to one embodiment of the present invention.

FIG. 1 is a cross-sectional view illustrating a semiconductor package through-electrode according to one embodiment of the present invention.

A semiconductor package through-electrode suitable for stacking a plurality of wafer-level semiconductor packages is shown in FIG. 1.

Referring to FIG. 1, a rectangular semiconductor chip 1 is illustrated for reference. The semiconductor chip 1 has a first surface 2 and a second surface 3 opposite the first surface 2.

The through-electrode 10 extends through the semiconductor chip 1. For example, the through-electrode 10 passes through the first surface 2 of the semiconductor chip 1 in a vertical direction. The through-electrode 10 has a length greater than the thickness of the semiconductor chip 1 and protrudes outwardly from the second surface 3 of the semiconductor chip 1.

According to an embodiment of the present invention, a first end 10a of the through-electrode 10 is arranged co-planar to the first surface 2 of the semiconductor chip 1. A second end 10b opposite the first end 10a of the through-electrode 10 protrudes outwardly from the second surface 3 of the semiconductor chip 1.

The through-electrode 10 has a double-electrode structure including a first electrode 11 and a second electrode 14.

The first electrode 11 of the through-electrode 10 has a recess portion 12 formed therein. The first electrode 11 having the recess portion 12 is, for example, pipe-shaped with one-side end blocked. The first electrode 11 has a length greater than a thickness of the semiconductor chip 1 and protrudes outwardly from the second surface 3 of the semiconductor chip 1.

The second electrode 14 of the through-electrode 10 is disposed within the recess portion 12 of the first electrode 11. The second electrode 14 may be disposed in such a way as to fill the recess portion 12 of the first electrode 11.

The first electrode 11 may include, for example, a first metal having a first hardness. The second electrode 14 may include a second metal having a second hardness that is relatively lower than the first hardness of the first electrode 11.

Alternatively, the first electrode 11 may include, for example, a first metal having a first melting point and the second electrode 14 may include a second metal having a second melting point relatively lower than the first melting point of the first electrode 11.

Materials such as copper, aluminum, aluminum alloy, and metal alloy may be used for the first electrode 11 having a first hardness and/or first melting point. Materials such as a solder containing lead (Pb) may be used for the second electrode 14 having a second hardness and/or second melting point.

Meanwhile, the first open end 10a of the first electrode 11 has a first extension portion 11a for increasing the total volume of the recess portion 12. The second electrode 14 has a second extension portion 14a having an increased area corresponding to the first extension portion 11a.

Figure 2:
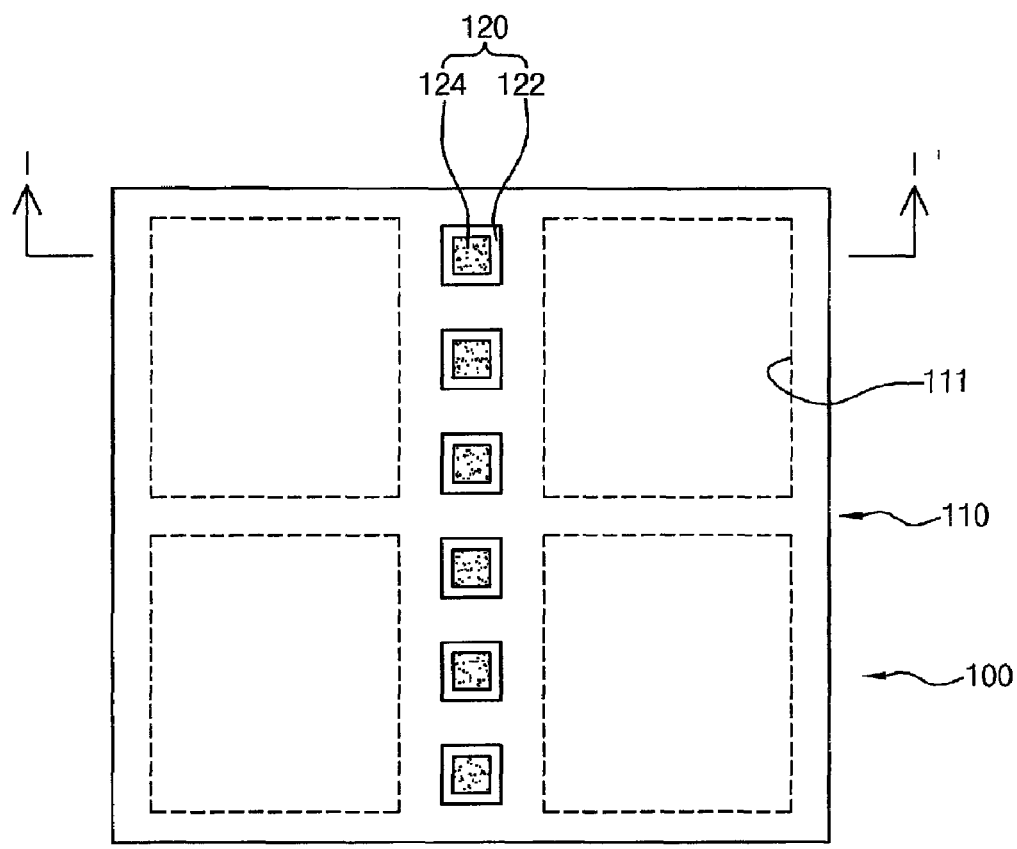
FIG. 2 is a plane view illustrating a semiconductor package having the through-electrode of FIG. 1.
Figure 3:
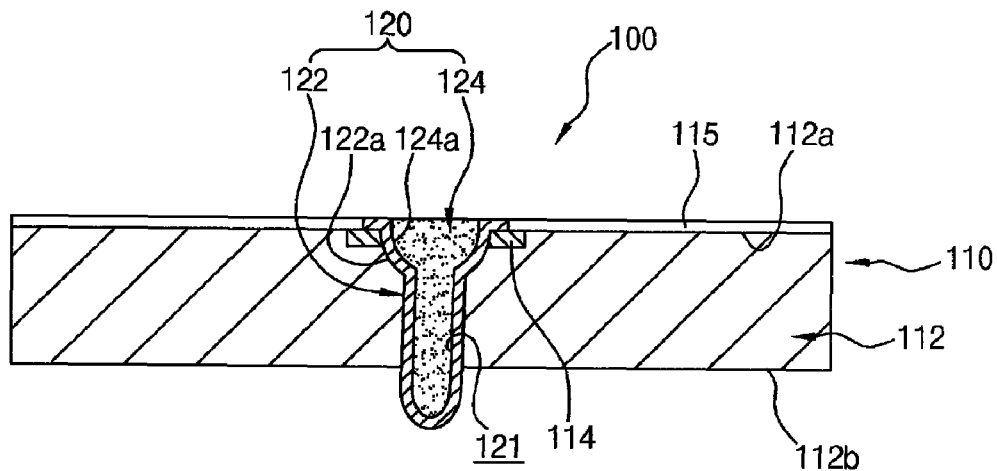
FIG. 3 is a cross-sectional view along a line I-I' of FIG. 2.

FIG. 2 is a plane view illustrating a semiconductor package having the through-electrode of FIG. 1. FIG. 3 is a cross-sectional view along a line I-I' of FIG. 2.

Referring to FIGS. 2 and 3, a semiconductor package 100 includes semiconductor chips 110 and through-electrodes 120.

The semiconductor chip 110 includes a semiconductor chip body 112 and a bonding pad 114. The semiconductor chip 110 may also include a passivation film 115 having an opening to expose a bonding pad 114.

The semiconductor chip body 112 is, for example, rectangular-shaped. The semiconductor chip body 112 has a first surface 112a and a second surface 112b opposite the first surface 112a.

The semiconductor chip body 112 includes, for example, at least one circuit unit 111. Each of the circuit units 111 include, for example, a data storage unit (not shown) for storing data and a data processing unit (not shown) for processing data. According to this embodiment of the present invention, four circuit units 111 are arranged on the semiconductor chip body 112 in a matrix form.

The bonding pad 114 is disposed on the first surface 112a of the semiconductor chip body 112. In this embodiment of the present invention, a plurality of bonding pads 114 are disposed on a center portion of the first surface 112a.

The bonding pad 114 is electrically connected to the data storage unit and/or the data processing unit of the circuit unit 111 in the semiconductor chip body 112.

The through-electrode 120 passes through the bonding pad 114 and the semiconductor chip body 112 corresponding to the bonding pad 114. One portion of the through-electrode 120 is electrically connected to the bonding pad 114 and one end of the through-electrode 120 protrudes outwardly by a prescribed height from the second surface 112b of the semiconductor chip body 112.

The through-electrode 120 includes the first electrode 122 and the second electrode 124. The through-electrode 120 may also include a seed metal layer (not shown) to cover a surface of the first electrode 122. The seed metal layer is selectively formed on a surface of the first electrode 122 in order to form the first electrode 122 via a plating method.

The first electrode 122 of the through-electrode 120 passes through the bonding pad 114 and the semiconductor chip body 112.

The first electrode 122 has a recess portion 121 for receiving the second electrode 124. The first electrode 122 having the recess portion 121 is pipe-shaped with one end blocked and the opposite end open. One portion of the first electrode 122 of the through-electrode 120 is electrically connected to the bonding pad 114. One portion of the first electrode 122 covers a top surface of the bonding pad 114 exposed by a passivation film pattern 115.

The second electrode 124 is disposed within the recess portion 121 of the first electrode 122.

The first electrode 122 may include, for example, a first metal having a first hardness. The second electrode 124 may include a second metal having a second hardness that is relatively lower than the first hardness of the first electrode 122. Materials such as copper, aluminum, aluminum alloy, and metal alloy may be used for the first electrode 122 having a first hardness. Materials such as a solder containing lead (Pb) may be used for the second electrode 124 having the second hardness.

Alternatively, the first electrode 122 includes, for example, a first metal having a first melting point. The second electrode 124 may include a second metal having a second melting point that is relatively lower than the first melting point of the first electrode 122. Materials such as copper, aluminum, aluminum alloy, and metal alloy may be used for the first electrode 122 having the first melting point. Materials such as a solder containing lead (Pb) may be used for the second electrode 124 having the second melting point lower than the first melting point.

Meanwhile, the entrance of the first electrode 122 has a first extension portion 122a. The second electrode 124 has a second extension portion 124a having an increased area corresponding to the first extension portion 122a.

Figure 4:
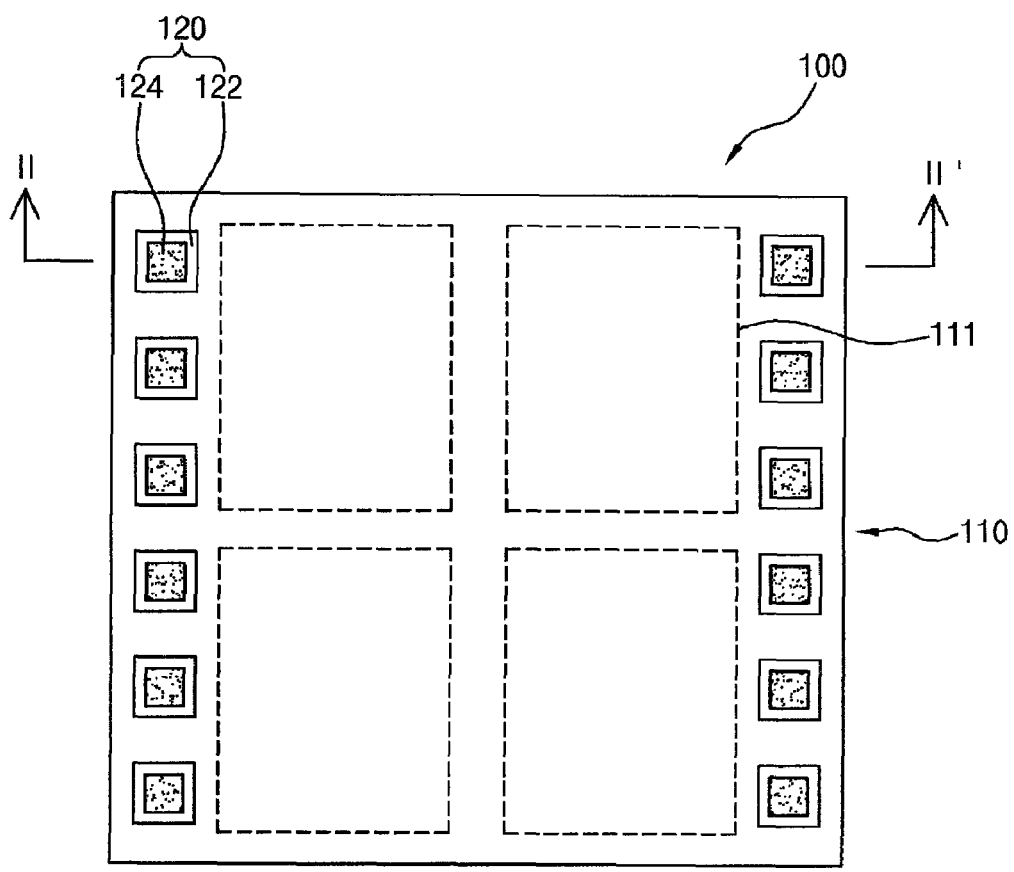
FIG. 4 is a plane view illustrating a semiconductor package according to one embodiment of the present invention.
Figure 5:
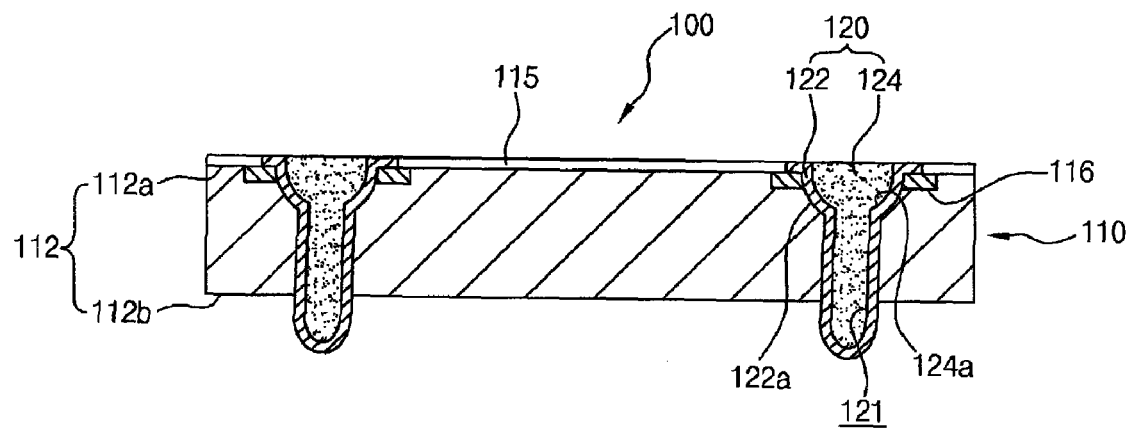
FIG. 5 is a cross-sectional view along a line II-II' of FIG. 4.

FIG. 4 is a plane view illustrating a semiconductor package according to one embodiment of the present invention. FIG. 5 is a cross-sectional view along a line II-II' of FIG. 4.

Referring to FIGS. 4 and 5, the semiconductor package 100 includes a semiconductor chip 110 and a through-electrode 120.

The semiconductor chip 110 includes a semiconductor chip body 112 and a bonding pad 116. The semiconductor chip 110 may also include a passivation film 115 having an opening to expose the bonding pad 116.

The semiconductor chip body 112 is, for example, rectangular-shaped. The semiconductor chip body 112 has a first surface 112a and a second surface 112b opposite the first surface 112a.

The semiconductor chip body 112 include, for example, at least one circuit unit 111. Each of the circuit units 111 includes, for example, a data storage unit (not shown) for storing data and a data processing unit (not shown) for processing data.

According to this embodiment of the present invention, four circuit units 111 are arranged on the semiconductor chip body 112 in a 2×2 matrix form.

The bonding pad 116 is disposed on the first surface 112a of the semiconductor chip body 112. In this embodiment of the present invention, a plurality of bonding pads 116 are disposed along opposite sides of the circuit units 111 in a 2×2 matrix form.

The bonding pad 116 is electrically connected to the data storage unit and/or the data processing unit of the circuit unit 111 of the semiconductor chip body 112.

The through-electrode 120 passes through each bonding pad 116 and the semiconductor chip body 112 corresponding to each bonding pad 116. One portion of the through-electrode 120 is electrically connected directly to the bonding pad 116 and one end of the through-electrode 120 protrudes outwardly by a prescribed height from the second surface 112b of the semiconductor chip body 112.

The through-electrode 120 has a double-electrode structure including a first electrode 122 and a second electrode 124. The first electrode 122 has a length greater than a thickness of the semiconductor chip body 112 and protrudes outwardly from the second surface 112b of the semiconductor chip body 112.

The first electrode 122 passes through the bonding pad 116 and the semiconductor chip body 112. The first electrode 122 has a recess portion 121 for receiving the second electrode 124. The first electrode 122 having the recess portion 121 is pipe-shaped with one-end blocked and the opposite end open. One portion of the first electrode 122 of the through-electrode 120 is electrically connected to the bonding pad 116. One portion of the first electrode 122 covers a top surface of the bonding pad 116 exposed by a passivation film pattern 115.

The second electrode 124 is disposed within the recess portion 121 of the first electrode 122.

The first electrode 122 may include, for example, a first metal having a first hardness. The second electrode 124 may include a second metal having a second hardness that is relatively lower than the first hardness of the first electrode 122. Materials such as copper, aluminum, aluminum alloy, and metal alloy may be used for the first electrode 122 having a first hardness. Materials such as a solder containing lead (Pb) may be used for the second electrode 124 having a second hardness.

Alternatively, the first electrode 122 includes, for example, a first metal having a first melting point. The second electrode 124 may include a second metal having a second melting point that is relatively lower than the first melting point of the first electrode 122. Materials such as copper, aluminum, aluminum alloy, and metal alloy may be used for the first electrode 122 having the first melting point. Materials such as a solder containing lead (Pb) may be used for the second electrode 124 having the second melting point lower than the first melting point.

Meanwhile, the entrance of the first electrode 122 has a first extension portion 122a for increasing the total volume of the recess portion 121. The second electrode 124 has a second extension portion 124a having an increased area corresponding to the first extension portion 122a.

Figure 6:
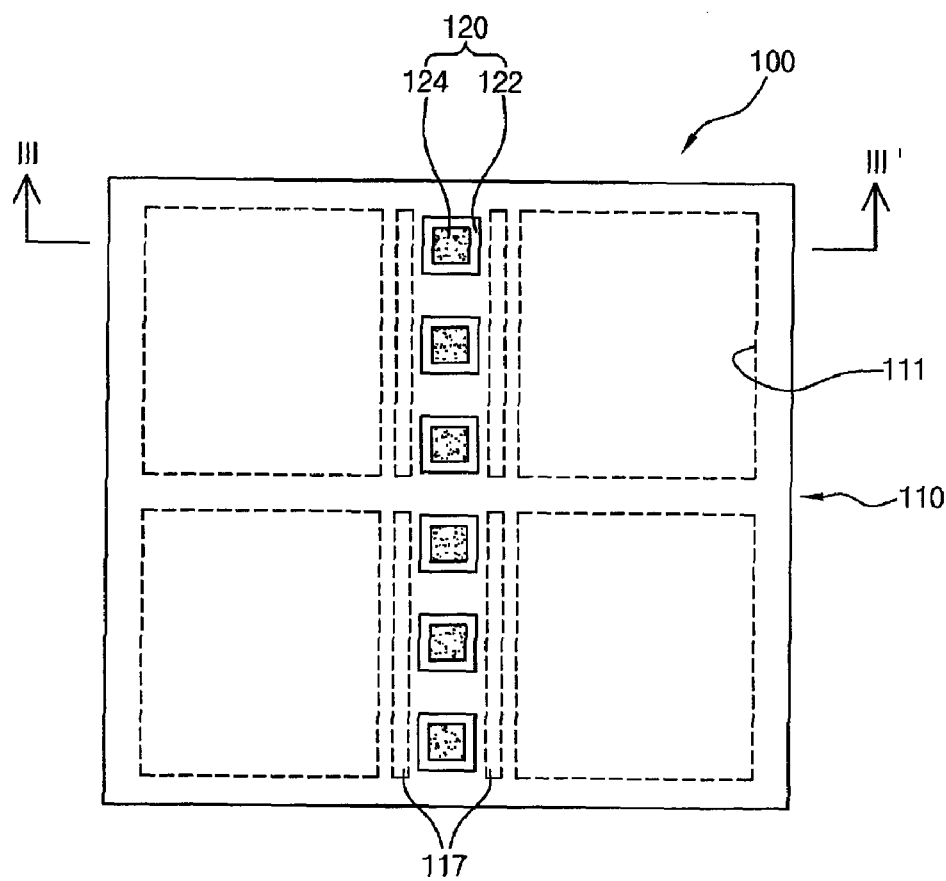
FIG. 6 is a plane view illustrating a semiconductor package according to one embodiment of the present invention.
Figure 7:
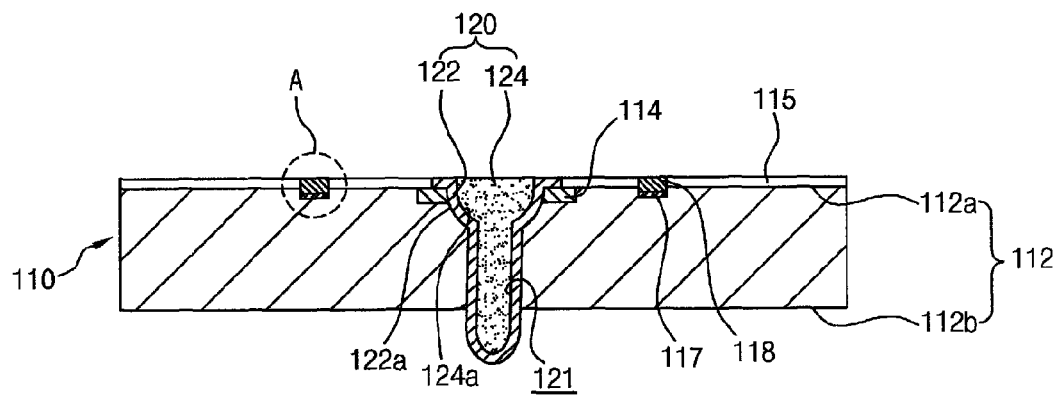
FIG. 7 is a cross-sectional view along a line of FIG. 2.
Figure 8:
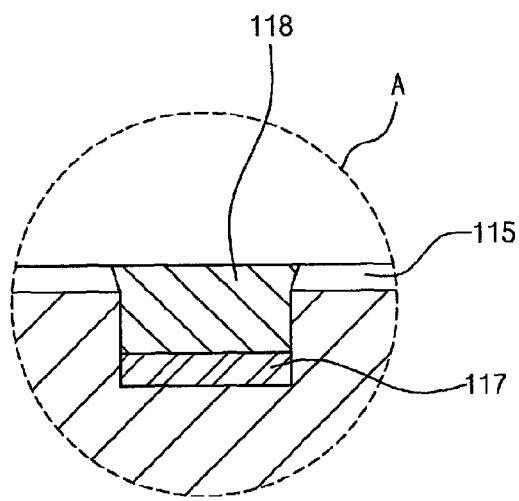
FIG. 8 is a partial enlargement view of 'A' shown in FIG. 7.

FIG. 6 is a plane view illustrating a semiconductor package according to one embodiment of the present invention. FIG. 7 is a cross-sectional view along a line of FIG. 6. FIG. 8 is a partial enlargement view of 'A' shown in FIG. 7.

Referring to FIGS. 6 to 8, the semiconductor package 100 includes a semiconductor chip 110 and through-electrodes 120.

The semiconductor chip 110 includes a semiconductor chip body 112, a bonding pad 114, a fuse 117 and a fuse insulating member 118. The semiconductor chip 110 may also include a passivation film 115 having an opening to expose the bonding pad 114.

The semiconductor chip body 112 is, for example, rectangular-shaped. The semiconductor chip body 112 has a first surface 112a and a second surface 112b opposite the first surface 112a.

The semiconductor chip body 112 includes circuit units 111. Each of the circuit units 111 include, for example, a data storage unit (not shown) for storing data and a data processing unit (not shown) for processing data. According to this embodiment of the present invention, four circuit units 111 are arranged on the semiconductor chip body 112 in a 2×2 matrix form.

The bonding pad 114 is disposed on the first surface 112a of the semiconductor chip body 112. In this embodiment of the present invention, a plurality of bonding pads 114 are disposed between a pair of adjacent circuit units 111.

The bonding pad 114 is electrically connected to the data storage unit and/or the data processing unit of the circuit unit 111 of the semiconductor chip body 112.

The fuse 117 is disposed between the bonding pads 114 and the circuit unit 111. A plurality of fuses 117 repair the circuit unit 111. The fuse insulating member 118 insulates the fuse 117. The fuse insulating member 118 includes, for example, organic materials. The fuse insulating member 118 may be selectively formed on a corresponding fuse 117. The fuse insulating member 118 may have a top surface substantially co-planar to that of the passivation film pattern 115.

The through-electrode 120 passes through the bonding pad 114 and the semiconductor chip body 112 corresponding to each bonding pad 114. One portion of the through-electrode 120 is electrically connected directly to the bonding pad 114 and one end of the through-electrode 120 protrudes outwardly by a prescribed height from the second surface 112b of the semiconductor chip body 112.

The through-electrode 120 has a double-electrode structure including a first electrode 122 and a second electrode 124. The first electrode 122 has a length greater than a thickness of the semiconductor chip body 112 and protrudes outwardly from the second surface 112b of the semiconductor chip body 112.

The first electrode 122 passes through the bonding pad 114 and the semiconductor chip body 112. The first electrode 122 has a recess portion 121 for receiving the second electrode 124. The first electrode 122 having the recess portion 121 is pipe-shaped with one-end blocked and the opposite end open. One portion of the first electrode 122 is electrically connected directly to the bonding pad 114. One portion of the first electrode 122 covers a top surface of the bonding pad 114 exposed by the passivation film pattern 115.

The second electrode 124 is disposed within the recess portion 121 of the first electrode 122.

According to this embodiment, the exposed first electrode 122 and the end of the second electrode 124 are arranged substantially co-planar to that of the passivation film pattern 115. The first electrode 122 covers the top surface of the bonding pad 114 that is exposed by the passivation film pattern 115.

The first electrode 122 include, for example, a first metal having a first hardness. The second electrode 124 may include a second metal having a second hardness that is relatively lower than the first hardness of the first electrode 122. Materials such as copper, aluminum, aluminum alloy, and metal alloy may be used for the first electrode 122 having a first hardness. Materials such as a solder containing lead (Pb) may be used for the second electrode 124 having a second hardness.

Alternatively, the first electrode 122 includes, for example, a first metal having a first melting point. The second electrode 124 may include a second metal having a second melting point that is relatively lower than the first melting point of the first electrode 122. Materials such as copper, aluminum, aluminum alloy, and metal alloy may be used for the first electrode 122 having the first melting point. Materials such as a solder containing lead (Pb) may be used for the second electrode 124 having the second melting point lower than the first melting point.

Meanwhile, the entrance of the first electrode 122 has a first extension portion 122a for increasing the total volume of the recess portion 121. The second electrode 124 has a second extension portion 124a having an increased area correspondingly to the first extension portion 122a.

Figure 9:
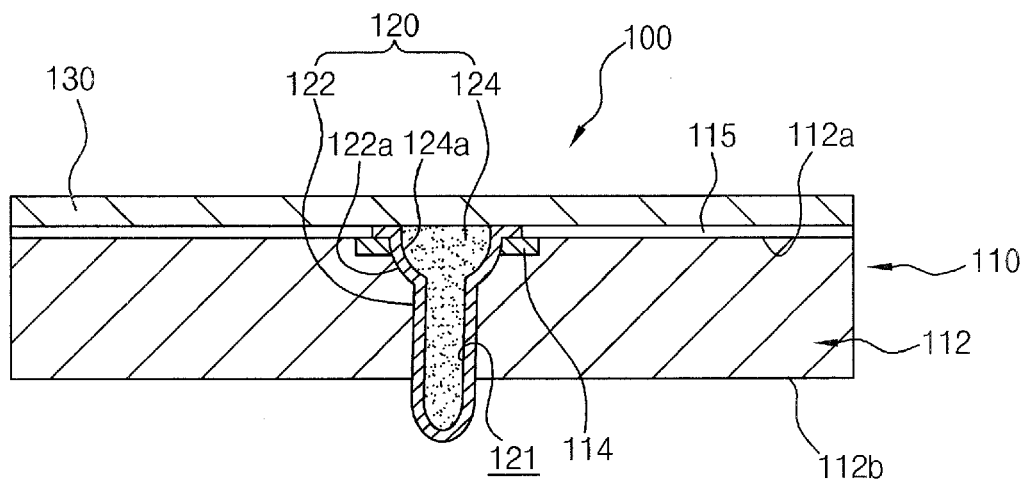
FIG. 9 is a cross-sectional view illustrating a semiconductor package according to one embodiment of the present invention.

FIG. 9 is a cross-sectional view illustrating a semiconductor package according to one embodiment of the present invention.

The semiconductor package shown in FIG. 9 is suitable for manufacturing a stacked semiconductor package by stacking at least two semiconductor packages on top of one another.

Referring to FIG. 9, the semiconductor package 100 includes a semiconductor chip 110, a through-electrode 120 and an insulating film 130.

The semiconductor chip 110 includes a semiconductor chip body 112 and a bonding pad 114. The semiconductor chip 110 may also include a passivation film pattern 115 having an opening to expose the bonding pad 114.

The semiconductor chip body 112 is, for example, rectangular-shaped having the circuit unit 111.

The semiconductor chip body 112 has a first surface 112a and a second surface 112b opposite to the first surface 112a.

The semiconductor chip body 112 includes a circuit unit 111 having a data storage unit and a data processing unit.

The bonding pad 114 is disposed on the first surface 112a of the semiconductor chip body 112. In this embodiment of the present invention, a plurality of bonding pads 114 are disposed between a pair of adjacent circuit units 111.

The bonding pad 114 is electrically connected to the data storage unit and/or the data processing unit of the circuit unit 111 in the semiconductor chip body 112.

The through-electrode 120 passes through the bonding pad 114 and the semiconductor chip body 112 corresponding to each bonding pad 114. One portion of the through-electrode 120 is electrically connected directly to the bonding pad 114 and one end of the through-electrode 120 protrudes outwardly by a prescribed height from the second surface 112b of the semiconductor chip body 112.

The through-electrode 120 has a double-electrode structure including a first electrode 122 and a second electrode 124. The first electrode 122 has a length greater than a thickness of the semiconductor chip body 112 and protrudes outwardly from the second surface 112b of the semiconductor chip body 112.

The first electrode 122 passes through the bonding pad 114 and the semiconductor chip body 112. The first electrode 122 has a recess portion 121 for receiving the second electrode 124. The first electrode 122 having the recess portion 121 is pipe-shaped with one-end blocked and the opposite end open. One portion of the first electrode 122 is electrically connected directly to the bonding pad 114. One portion of the first electrode 122 covers a top surface of the bonding pad 114 exposed by the passivation film pattern 115.

The second electrode 124 is disposed within the recess portion 121 of the first electrode 122.

The first electrode 122 may include, for example, a first metal having a first hardness. The second electrode 124 may include a second metal having a second hardness that is relatively lower than the first hardness of the first electrode 122. Materials such as copper, aluminum, aluminum alloy, and metal alloy may be used for the first electrode 122 having a first hardness. Materials such as a solder containing lead (Pb) the second electrode 124 having a second hardness.

Alternatively, the first electrode 122 includes, for example, a first metal having a first melting point. The second electrode 124 may include a second metal having a second melting point that is relatively lower than the first melting point of the first electrode 122. Materials such as copper, aluminum, aluminum alloy, and metal alloy may be used for the first electrode 122 having the first melting point. Materials such as a solder containing lead (Pb) may be used for the second electrode 124 having the second melting point lower than the first melting point.

Meanwhile, the entrance of the first electrode 122 has a first extension portion 122a for increasing the total volume of the recess portion 121. The second electrode 124 has a second extension portion 124a having an increased area correspondingly to the first extension portion 122a.

The insulating film 130 is formed on the passivation layer 115 of the semiconductor chip body 112 to cover the first electrode 122 and the second electrode 124 of the through-electrode 120 that are exposed from the passivation layer 115. The insulating film 130 may be an organic film. The thickness of the insulating film 130 is smaller than the length of the through-electrode that protrudes from the second surface 112b of the semiconductor chip body 112.

Figure 10:
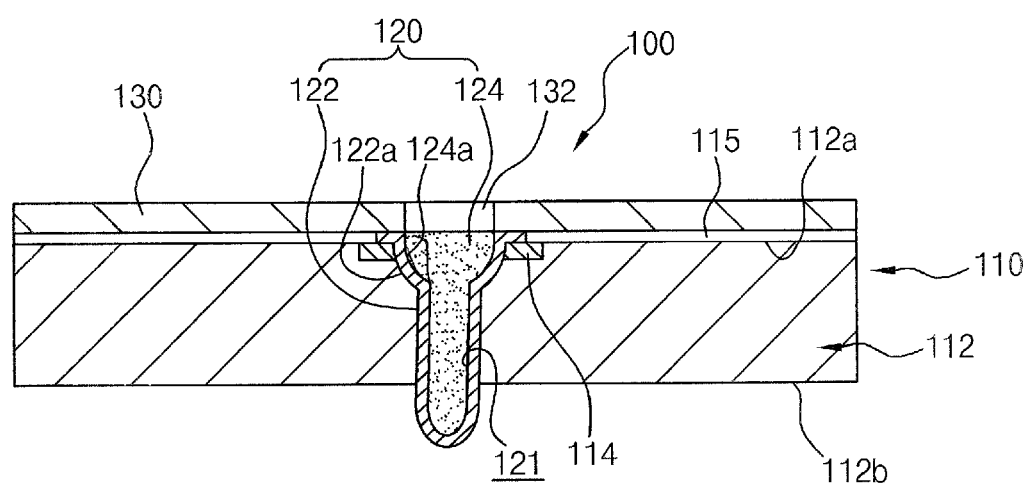
FIG. 10 is a cross-sectional view illustrating an opening formed on an insulating layer shown in FIG. 9.

FIG. 10 is a cross-sectional view illustrating that an opening is formed on the insulating film shown in FIG. 9.

Referring to FIG. 10, the insulating film 130, covering the passivation layer 115 of the semiconductor chip body 112, has an opening 132. In this embodiment of the present invention, the opening 132 of the insulating film 130 may selectively expose the second electrode 124 of the through-electrode 120. Alternatively, the opening 132 of the insulating film 130 may expose both the second electrode 124 as well as the first electrode 122.

Figure 11:
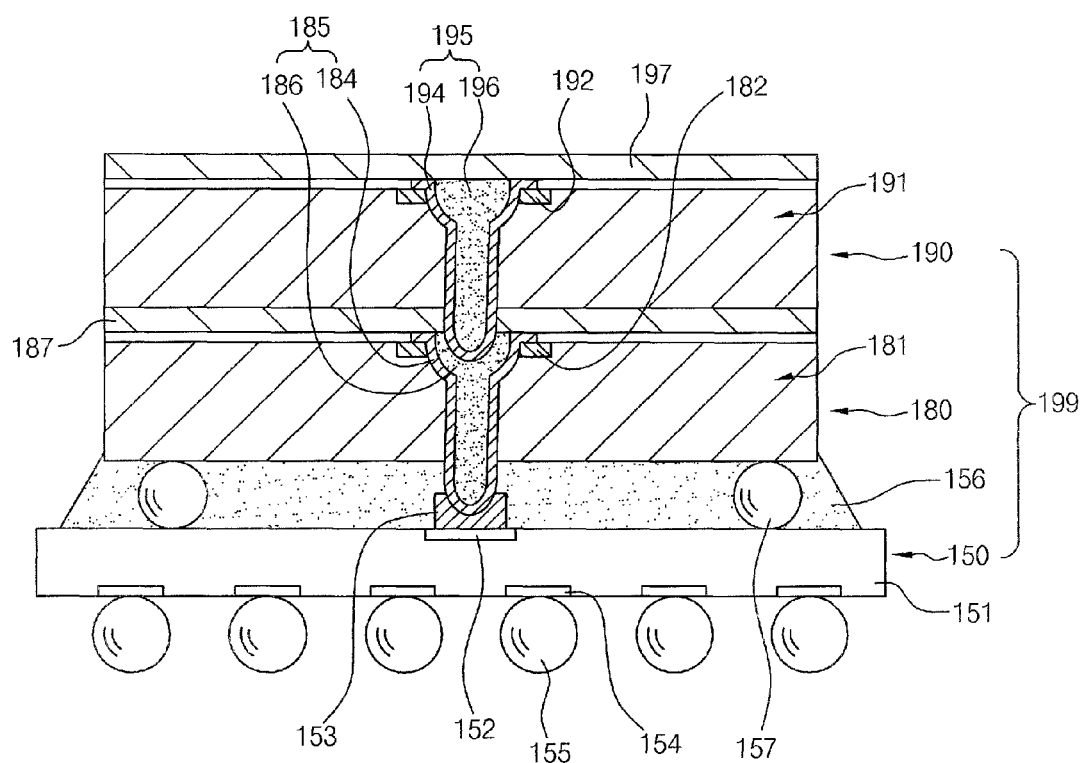
FIG. 11 is a cross-sectional view illustrating a stacked semiconductor package having the through-electrode of FIG. 1.

FIG. 11 is a cross-sectional view illustrating a stacked semiconductor package having the through-electrode shown in FIG. 1.

Referring to FIG. 11, the stacked semiconductor package 199 includes a lower semiconductor package 180, an upper semiconductor package 190 and a substrate 150. The stacked semiconductor package 199 may also include a dummy chip support member 157.

The lower semiconductor package 180 includes a lower semiconductor chip body 181 and a bonding pad 182.

The lower semiconductor package body 181 includes a circuit unit (not shown) having a data storage unit (not shown) for storing data and a data processing unit (not shown) for processing data.

The bonding pad 182 is disposed on a top surface of the lower semiconductor chip body 181. In this embodiment of the present invention, a plurality of bonding pads 182 are disposed on a center portion of the top surface of the lower semiconductor chip body 181. Circuit units are disposed on both side of the bonding pad 182.

The bonding pad 182 is electrically connected to the data storage unit and/or the data processing unit of the circuit unit in the lower semiconductor chip body 181.

The lower through-electrode 185 passes through the bonding pad 182 and the lower semiconductor chip body 181 corresponding to the bonding pad 182. One portion of the lower through-electrode 185 is electrically connected directly to the bonding pad 182 and one end of the lower through-electrode 185 protrudes outwardly from a bottom surface of the lower semiconductor chip body 181.

The lower through-electrode 185 has a double-electrode structure including a first electrode 184 and a second electrode 186. The first electrode 184 has a length greater than a thickness of the lower semiconductor chip body 181 and protrudes outwardly from a bottom surface of the lower semiconductor chip body 181.

The first electrode 184 passes through the bonding pad 182 and the lower semiconductor chip body 181. The first electrode 184 has a recess portion for receiving the second electrode 186. One portion of the first electrode 184 covers the bonding pad 182.

The second electrode 186 is disposed within the recess portion of the first electrode 184.

The first electrode 184 may include, for example, a first metal having a first hardness. The second electrode 186 may include a second metal having a second hardness that is relatively lower than the first hardness of the first electrode 184.

Materials such as copper, aluminum, aluminum alloy, and metal alloy may be used for the first electrode 184 having a first hardness. Materials such as a solder containing lead (Pb) may be used for the second electrode 186 having a second hardness.

Alternatively, the first electrode 184 includes, for example, a first metal having a first melting point. The second electrode 186 may include a second metal having a second melting point that is relatively lower than the first melting point of the first electrode 184.

Materials such as copper, aluminum, aluminum alloy, and metal alloy may be used for the first electrode 184 having the first melting point. Materials such as a solder containing lead (Pb) may be used for the second electrode 186 having a second melting point lower than the first melting point.

The insulating film 187 is formed on the top surface of the lower semiconductor chip body 181 of the lower semiconductor package 180 to cover the top surface.

The upper semiconductor package 190 is disposed over the lower semiconductor package 180.

The upper semiconductor package 190 includes an upper semiconductor chip body 191 and a bonding pad 192.

The upper semiconductor package body 191 includes a circuit unit (not shown) having a data storage unit (not shown) for storing data and a data processing unit (not shown) for processing data. The bonding pad 192 is disposed on a top surface of the upper semiconductor chip body 191. In this embodiment of the present invention, a plurality of bonding pads 192 is disposed on a center portion of the top surface of the upper semiconductor chip body 191. The bonding pad 192 of the upper semiconductor chip body 191 is disposed on a position corresponding to the bonding pad 182 of the lower semiconductor chip body 181. Circuit units are disposed on both side of the bonding pad 192.

The bonding pad 192 of the upper semiconductor chip body 191 is electrically connected to the data storage unit and/or the data processing unit of the circuit unit.

The upper through-electrode 195 passes through the bonding pad 192 and the lower semiconductor chip body 191 corresponding to the bonding pad 192. One portion of the upper through-electrode 195 is electrically connected directly to the bonding pad 192 and one end of the upper through-electrode 195 protrudes outwardly from a bottom surface of the upper semiconductor chip body 191. The upper through-electrode 195 passes through the insulating film 187 of the lower semiconductor chip package 180 to electrically connect to the lower through-electrode 185.

The upper through-electrode 195 has a double-electrode structure including a first electrode 194 and a second electrode 196. The first electrode 194 has a length greater than a thickness of the upper semiconductor chip body 191 and protrudes outwardly from a bottom surface of the upper semiconductor chip body 191.

The first electrode 194 passes through the bonding pad 192 and the upper semiconductor chip body 191. The first electrode 194 has a recess portion for receiving the second electrode 196. One portion of the first electrode 194 covers the bonding pad 192.

The second electrode 196 is disposed within the recess portion of the first electrode 194.

The first electrode 194 may include, for example, a first metal having a first hardness. The second electrode 196 may include a second metal having a second hardness that is relatively lower than the first hardness of the first electrode 194.

Materials such as copper, aluminum, aluminum alloy, and metal alloy may be used for the first electrode 194 having a first hardness. Materials such as a solder containing lead (Pb) may be used for the second electrode 196 having a second hardness.

Alternatively, the first electrode 194 includes, for example, a first metal having a first melting point. The second electrode 196 may include a second metal having a second melting point that is relatively lower than the first melting point of the first electrode 194.

Materials such as copper, aluminum, aluminum alloy, and metal alloy may be used for the first electrode 194 having the first melting point. Materials such as a solder containing lead (Pb) may be used for the second electrode 196 having a second melting point lower than the first melting point.

The insulating film 197 is formed on the top surface of the lower semiconductor chip body 191 of the upper semiconductor package 190 to cover the top surface.

The first electrode 194 of the upper through-electrode 195 of the upper semiconductor package 190 passes through the insulating film 187 formed on the top surface of the lower semiconductor package 180 electrically connect to the second electrode 186 of the lower through-electrode 185 of the lower semiconductor package 180. Thus, the upper and lower semiconductor packages 180, 190 may be stacked without a gap between the upper semiconductor package 190 and the lower semiconductor package 180 using the insulating film 187.

The substrate 150 is electrically connected to the lower semiconductor package 180. The substrate 150 includes a substrate body 151, a connection pad 152 disposed on a top surface of the substrate body 151, a solder layer 153 disposed on the connection pad 152, a ball land 154 disposed on a bottom surface opposite the top surface of the substrate body 151, and a solder ball placed on the ball land 154.

The connection pad 152 is electrically connected to the first electrode 184 of the lower through-electrode 185 that protrudes from the bottom surface of the lower semiconductor chip body 181. The first electrode 184 of the lower through-electrode 185 is electrically connected to the solder layer 153 disposed on the connection pad 152.

A dummy chip support member 157 is interposed between the lower semiconductor package 180 and the substrate 150. A plurality of dummy chip support members 157 may be disposed along, for example, an edge of the lower semiconductor package 180. The dummy chip support member 157 may be a dummy solder ball, dummy bump, or a closed-loop shaped dummy support member. The dummy chip support member 157 is interposed between the lower semiconductor package 180 and the substrate 150 to support the lower semiconductor package 180 stably.

Subsequently, an under-fill member 156 may be interposed between the substrate 150 and the lower semiconductor package 180 to prevent a void space from being formed between the substrate 150 and the lower semiconductor package 180.

Figure 12:
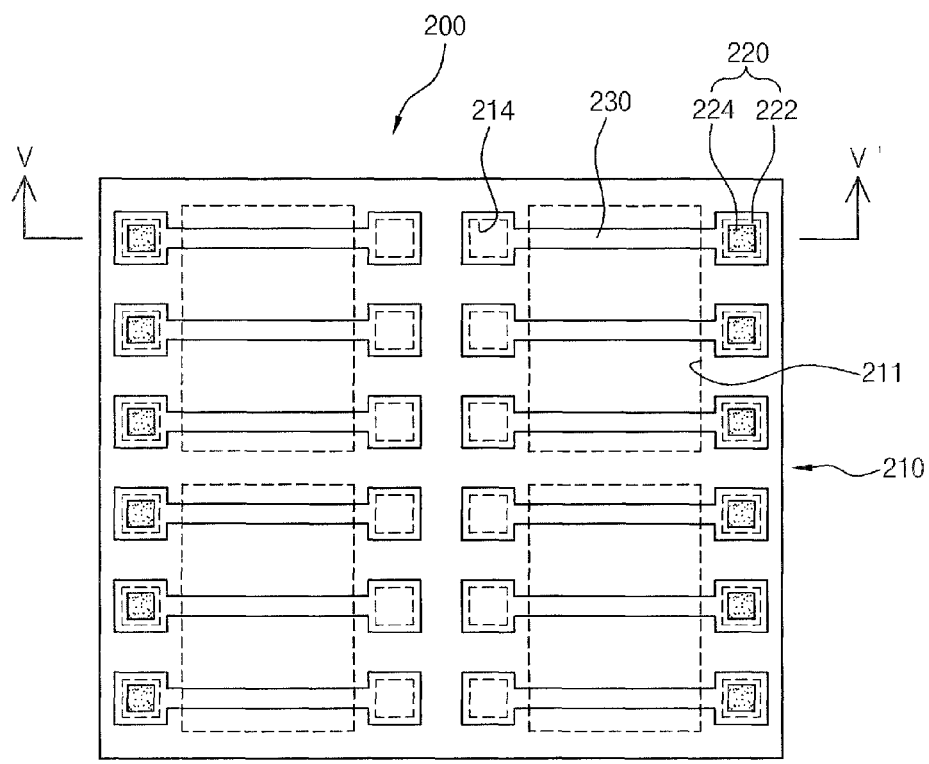
FIG. 12 is a plane view illustrating a semiconductor package according to one embodiment of the present invention.
Figure 13:
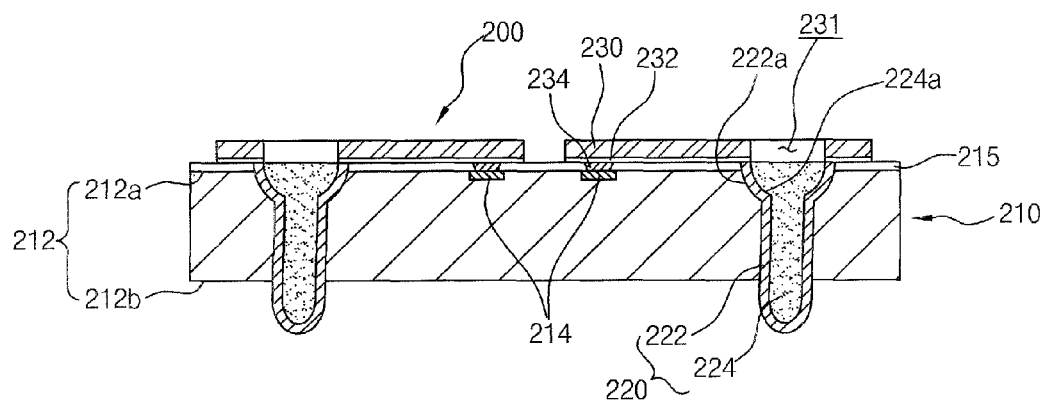
FIG. 13 is a cross-sectional view along a line IV-IV' of FIG. 12.

FIG. 12 is a plane view illustrating a semiconductor package according to one embodiment of the present invention. FIG. 13 is a cross-sectional view along a line IV-IV' of FIG. 12.

Referring to FIGS. 12 and 13, the semiconductor package 200 includes a semiconductor chip 210, a through-electrode 220 and a re-distribution layer 230.

The semiconductor chip 210 includes a semiconductor chip body 212 and a bonding pad 214. The semiconductor chip 210 may also include a passivation film 215 having an opening to expose the bonding pad 214.

The semiconductor chip body 112 is, for example, rectangular-shaped.

The semiconductor chip body 212 has a first surface 212a and a second surface 212b opposite the first surface 212a.

The semiconductor chip body 212 includes a circuit unit 211. The circuit unit 211 includes, for example, a data storage unit (not shown) for storing data and a data processing unit (not shown) for processing data.

The bonding pad 214 is disposed on the first surface 212a of the semiconductor chip body 212. In this embodiment of the present invention, a plurality of bonding pads 214 are disposed on a center portion of the first surface 212a.

The bonding pad 214 is electrically connected to the data storage unit and/or the data processing unit of the circuit unit 211 in the semiconductor chip body 212.

The through-electrode 220 passes through the semiconductor chip body 212 of the semiconductor chip 210. The through-electrode 220 passes through, for example, an edge of the semiconductor chip body 212 distantly spaced from the bonding pad 214. The end of the through-electrode 220 protrudes outwardly from the second surface 212b of the semiconductor chip body 212.

The through-electrode 220 includes a first electrode 222 and a second electrode 224. The through-electrode 220 may also include a seed metal layer (not shown) disposed on a surface of the first electrode 222. The seed metal layer may be selectively formed via a plating method on the surface of the first electrode 222 upon formation of the first electrode 222.

The first electrode 222 passes through the semiconductor chip body 212. The first electrode 222 has a recess portion 221 for receiving the second electrode 224. The first electrode 222 having the recess portion 221 is pipe-shaped with one-end blocked and the opposite end open.

The second surface 224 is disposed within the recess unit 221 of the first electrode 222.

The first electrode 222 may include, for example, a first metal having a first hardness. The second electrode 224 may include a second metal having a second hardness that is relatively lower than the first hardness of the first electrode 222.

Materials such as copper, aluminum, aluminum alloy, and metal alloy may be used for the first electrode 222 having a first hardness. Materials such as a solder containing lead (Pb) may be used for the second electrode 224 having a second hardness.

Alternatively, the first electrode 222 includes, for example, a first metal having a first melting point. The second electrode 224 may include a second metal having a second melting point that is relatively lower than the first melting point of the first electrode 222.

Materials such as copper, aluminum, aluminum alloy, and metal alloy may be used for the first electrode 222 having the first melting point. Materials such as a solder containing lead (Pb) may be used for the second electrode 224 having a second melting point lower than the first melting point.

Meanwhile, the entrance of the first electrode 222 has a first extension portion 222a for increasing the total volume of the recess portion 221. The second electrode 224 has a second extension portion 224a having an increased area correspondingly to the first extension portion 222a.

The re-distribution layer 230 is arranged on the passivation layer 215 on first surface 212a of the semiconductor chip body 212. The re-distribution layer 230 connects the bonding pad 214 disposed on the center portion of the semiconductor chip body 212 with the through-electrode 220 disposed along an edge of the semiconductor chip body 212. The re-distribution pattern 230 has a linear shape when in plane view.

According to this embodiment of the present invention, a seed metal pattern 232 may be arranged between the re-distribution layer 230 and the semiconductor chip body 212. The seed metal pattern 232 is interposed between the semiconductor chip body 212 and the re-distribution layer 230 in order to form the re-distribution pattern 230 via a plating method.

The seed metal pattern 232 has same shape and same size as those of the re-distribution layer 230.

Materials such as copper, aluminum, gold, and metal alloy may be used for the re-distribution layer.

The connection pattern 234 is arranged between the re-distribution layer 230 and the bonding pad 214. The connection pattern 234 has a top surface arranged on substantially co-planar to the top surface of the passivation film pattern 215. The connection pattern 234 contains substantially the same material as that of the first electrode 222 of the through-electrode 220.

The re-distribution layer 230 may include an opening 231 to selectively expose the second electrode 224 of the through-electrode 220.

Figure 14:
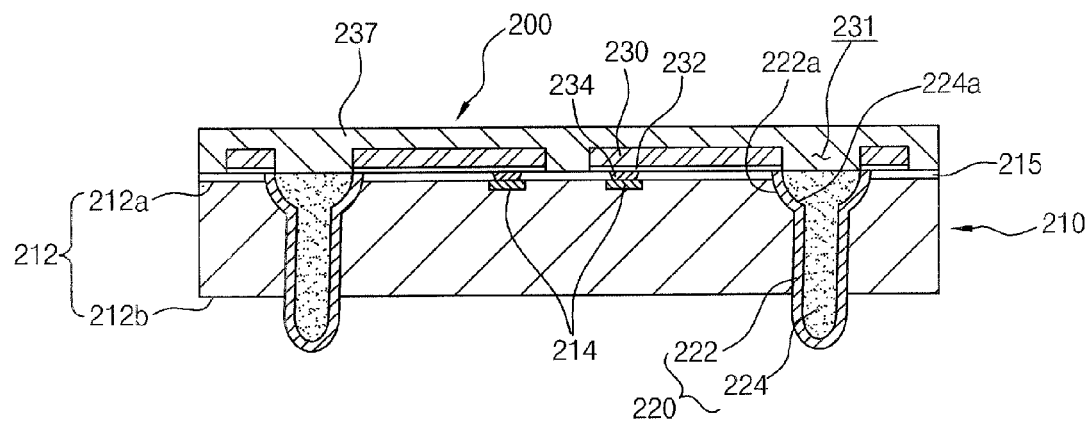
FIG. 14 is a cross-sectional view illustrating an insulating layer formed on the semiconductor package shown in FIG. 13.

FIG. 14 is a cross-sectional view illustrating that an insulating layer 237 is formed on the semiconductor package shown in FIG. 13.

Referring to FIG. 14, an insulating film 237 is formed over a first surface 212a of the semiconductor chip body 212 of the semiconductor package 100. The end of the through-electrode 220 and the re-distribution layer 230 are covered by the insulating film 237. In this embodiment of the present invention, the insulating film 237 contains, for example, organic materials.

Figure 15:
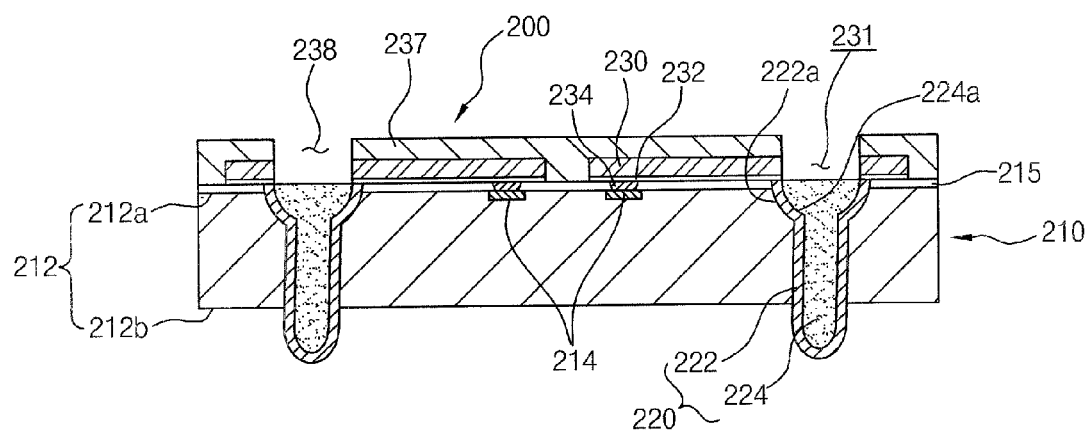
FIG. 15 is a cross-sectional view illustrating the opening formed on the insulating layer of FIG. 14.

FIG. 15 is a cross-sectional view illustrating that an opening is formed on the insulating layer shown in FIG. 14.

Referring to FIG. 15, the semiconductor chip body 212 of the semiconductor package 200 may further include an opening 238 on the first surface 212a to selectively expose a second electrode 224 of the through-electrode 220.

Figure 16:
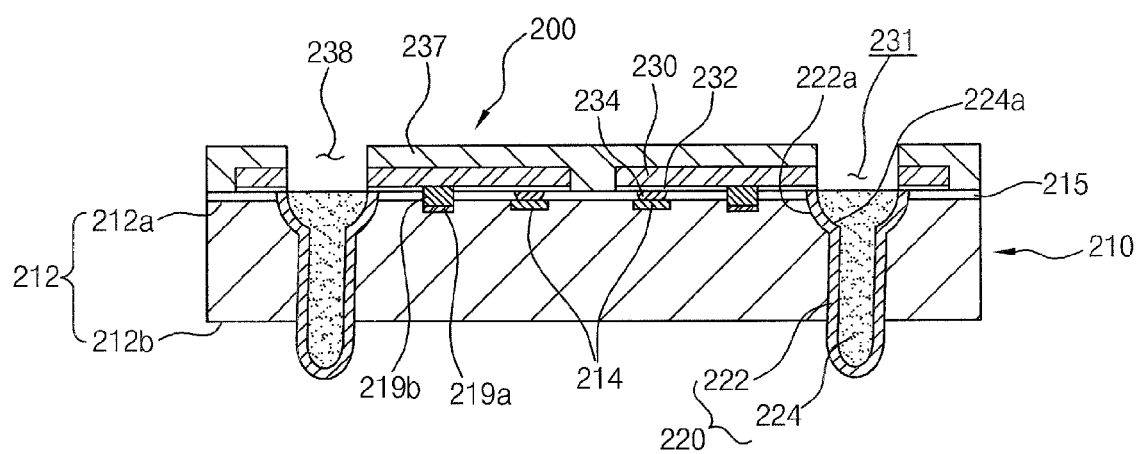
FIG. 16 is a cross-sectional view illustrating the semiconductor package according to one embodiment of the present invention.

FIG. 16 is a cross-sectional view illustrating the semiconductor package according to one embodiment of the present invention. The semiconductor package according to one embodiment of the present invention is substantially the same as that earlier explained in connection with FIG. 15 except with respect to the fuse and the fuse insulating member. Therefore, an explanation as to those portions will be omitted.

The same reference numerals and names as in FIG. 13 will be designated for the same parts of FIG. 16.

Referring to FIG. 16, the semiconductor package 200 include a semiconductor chip 210 and a through-electrode 220.

The semiconductor chip 210 includes a semiconductor chip body 212, a bonding pad 214, a fuse 219a and a fuse insulating member 219b. The semiconductor chip 210 may also include a passivation film 215 having an opening to expose the bonding pad 214.

The semiconductor chip body 212 includes, for example, a circuit unit (not shown). The circuit unit includes, for example, a data storage unit (not shown) for storing data and a data processing unit (not shown) for processing data. In this embodiment of the present invention, a plurality of circuit units are disposed in an edge portion of the semiconductor chip body 212.

The semiconductor chip body 212 is, for example, rectangular-shaped. The semiconductor chip body 212 has a first surface 212a and a second surface 212b opposite the first surface 212a.

The bonding pad 214 is disposed on, for example, an edge of the first surface 212a of the semiconductor chip body 212.

The bonding pad 214 is electrically connected to the data storage unit and/or the data processing unit of the circuit unit in the semiconductor chip body 212.

The fuse 219a is disposed between the bonding pads 214 and the through-electrode 220. A plurality of fuses 219a repair the circuit unit 211. The fuse insulating member 219b prevents the re-distribution layer 230 and the fuses 219a from being electrically shorted. The fuse insulating member 219b contains, for example, organic material. The fuse insulating member 219b may be selectively formed on a position corresponding to that of the fuse 219a. The fuse insulating member 219b has a top surface arranged on substantially co-planar to that of the passivation film 215.

Figure 17:
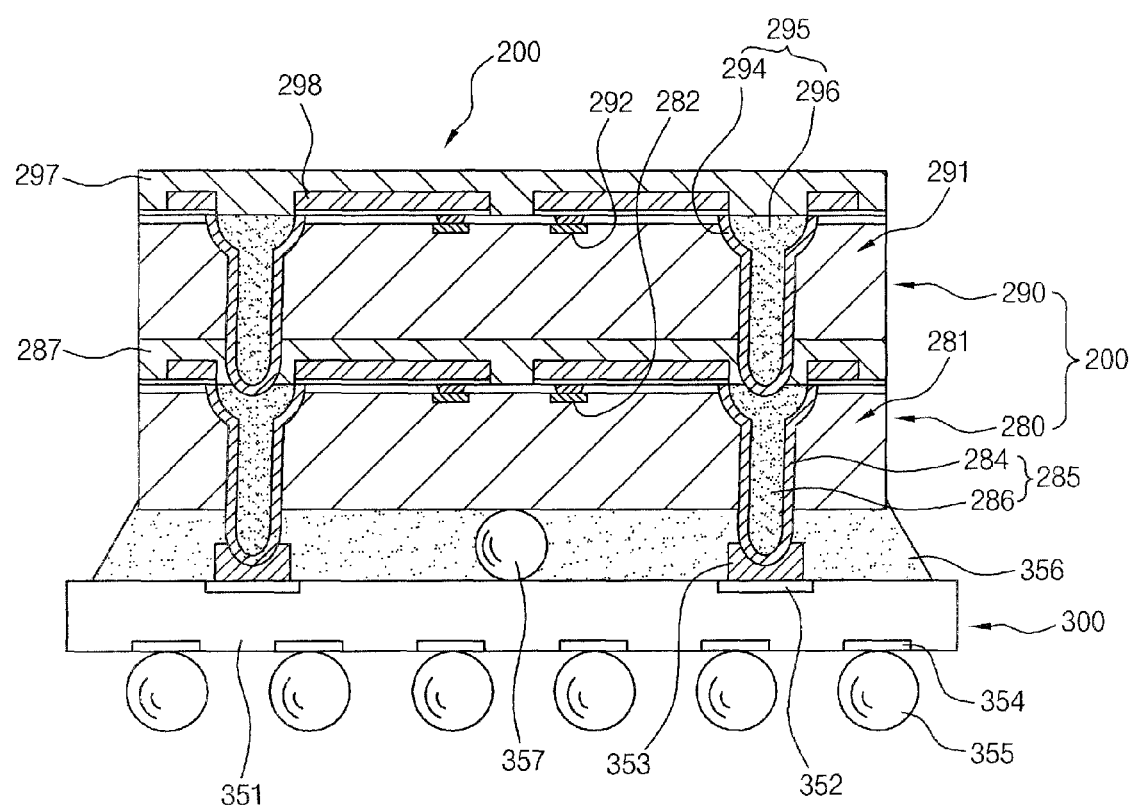
FIG. 17 is a cross-sectional view illustrating the semiconductor package according to one embodiment of the present invention.

FIG. 17 is a cross-sectional view illustrating the semiconductor package according to one embodiment of the present invention.

Referring to FIG. 17, the semiconductor package 200 includes a lower semiconductor package 280, an upper semiconductor package 290 and a substrate 300. The semiconductor package 200 may also include a dummy chip support member 357.

The lower semiconductor package 280 includes a lower semiconductor chip body 281 and a bonding pad 282.

The lower semiconductor chip body 281 includes a circuit unit (not shown) having a data storage unit (not shown) for storing data and a data processing unit (not shown) for processing data.

The bonding pad 282 is disposed on a top surface of the lower semiconductor chip body 281. In this embodiment of the present invention, a plurality of bonding pads 282 are disposed on a center portion of the top surface of the lower semiconductor chip body 281.

The bonding pad 282 is electrically connected to the data storage unit and/or the data processing unit of the circuit unit in the lower semiconductor chip body 281.

The lower through-electrode 285 passes through the lower semiconductor chip body 281 separated distantly from the bonding pad 282. One portion of the lower through-electrode 285 protrudes outwardly from a bottom surface of the lower semiconductor chip body 281.

The lower through-electrode 285 has a double-electrode structure including a first electrode 284 and a second electrode 286. The first electrode 284 has a length greater than a thickness of the lower semiconductor chip body 281 and protrudes outwardly from a bottom surface of the lower semiconductor chip body 281.

The first electrode 284 passes through the lower semiconductor chip body 281. The first electrode 284 has a recess portion for receiving the second electrode 286.

The second electrode 286 is disposed within the recess portion of the first electrode 284.

The first electrode 284 may include, for example, a first metal having a first hardness. The second electrode 286 may include a second metal having a second hardness that is relatively lower than the first hardness of the first electrode 284.

Materials such as copper, aluminum, aluminum alloy, and metal alloy may be used for the first electrode 284 having a first hardness. Materials such as a solder containing lead (Pb) may be used for the second electrode 286 having a second hardness.

Alternatively, the first electrode 284 includes, for example, a first metal having a first melting point. The second electrode 286 may include a second metal having a second melting point that is relatively lower than the first melting point of the first electrode 284.

Materials such as copper, aluminum, aluminum alloy, and metal alloy may be used for the first electrode 284 having the first melting point. Materials such as a solder containing lead (Pb) may be used for the second electrode 286 having a second melting point lower than the first melting point.

A re-distribution layer 288 electrically connects the bonding pad 282 disposed on a center portion of the lower semiconductor chip body 281 with the through-electrode 285 disposed on an edge of the lower semiconductor chip body 281. The re-distribution layer 288 has an opening to expose the second electrode 286 of the through-electrode 285.

An insulating film 287 is formed on a top surface of the lower semiconductor chip body 281 of the lower semiconductor package 280 to cover the top surface.

The upper semiconductor package 290 is disposed over the lower semiconductor chip body 280.

The upper semiconductor package 290 includes an upper semiconductor chip body 291 and a bonding pad 292

The upper semiconductor chip body 291 includes a circuit unit (not shown) having a data storage unit (not shown) for storing data and a data processing unit (not shown) for processing data.

The bonding pad 292 is disposed on a top surface of the upper semiconductor chip body 291. In this embodiment of the present invention, a plurality of bonding pads 292 are disposed on a center portion of the top surface of the upper semiconductor chip body 291. The bonding pad 292 of the upper semiconductor chip body 291 is disposed on a position corresponding to that of the bonding pad 282 of the lower semiconductor chip body 281.

The bonding pad 292 is electrically connected with the data storage unit and/or the data processing unit of the circuit unit in the upper semiconductor chip body 291.

The upper through-electrode 295 passes through the upper semiconductor chip body 291. One portion of the lower through-electrode 295 protrudes outwardly from a bottom surface of the lower semiconductor chip body 291. The upper through-electrode 295 is electrically connected to the lower through-electrode 285.

The upper through-electrode 295 has a double-electrode structure including a first electrode 294 and a second electrode 296. The first electrode 294 has a length greater than a thickness of the upper semiconductor chip body 291 and protrudes outwardly from a bottom surface of the upper semiconductor chip body 291.

The first electrode 294 passes through the upper semiconductor chip body 291. The first electrode 294 has a recess portion for receiving the second electrode 296.

The second electrode 296 is disposed within the recess portion of the first electrode 294.

The first electrode 294 may include, for example, a first metal having a first hardness. The second electrode 296 may include a second metal having a second hardness that is relatively lower than the first hardness of the first electrode 294.

Materials such as copper, aluminum, aluminum alloy, and metal alloy may be used for the first electrode 294 having a first hardness. Materials such as a solder containing lead (Pb) may be used for the second electrode 296 having a second hardness.

Alternatively, the first electrode 294 includes, for example, a first metal having a first melting point. The second electrode 296 may include a second metal having a second melting point that is relatively lower than the first melting point of the first electrode 294.

Materials such as copper, aluminum, aluminum alloy, and metal alloy may be used for the first electrode 294 having the first melting point. Materials such as a solder containing lead (Pb) may be used for the second electrode 296 having a second melting point lower than the first melting point.

An insulating film 297 is formed on a top surface of the upper semiconductor chip body 291 of the upper semiconductor package 290 to cover the top surface.

The first electrode 294 of the upper through-electrode 295 of the upper semiconductor package 290 passes through the insulating film 287 formed on the top surface of the lower semiconductor package 280 to electrically connect the second electrode 286 of the lower through-electrode 285 of the lower semiconductor package 280. Thus, the upper and lower semiconductor packages 280, 290 may be stacked without a gap between the upper semiconductor package 290 and the lower semiconductor package 280 using the insulating film 287.

The substrate 300 is electrically connected with the lower semiconductor package 280. The substrate 300 includes a substrate body 351, a connection pad 352 disposed on a top surface of the substrate body 351, a solder layer 353 disposed on the connection pad 352, a ball land 354 disposed on a bottom surface opposite to the top surface of the substrate body 351, and a solder ball 355 placed on the ball land 354.

The connection pad 352 is electrically connected to the first electrode 284 of the lower through-electrode 285 that protrudes from the bottom surface of the lower semiconductor chip body. The first electrode 284 of the lower through-electrode 285 is electrically connected to the solder layer 353 disposed on the connection pad 352.

A dummy chip support member 357 is interposed between the lower semiconductor package 280 and the substrate 350. A plurality of the dummy chip support members 357 may be disposed on a center portion of the lower semiconductor package 280. The dummy chip support member 357 may be a dummy solder ball, dummy bump or closed-loop shaped dummy support member. The dummy chip support member 357 is interposed between the lower semiconductor package 280 and the substrate 300 to support the lower semiconductor package 280 stably.

Subsequently, an under-fill member 356 may be interposed between the substrate 300 and the lower semiconductor package 280 to prevent a void space from being formed between the substrate 300 and the lower semiconductor package 280.

As specifically explained above, the through-electrode passing through the semiconductor chip body may be formed with the first metal having a first hardness and/or a first melting point and a second metal having a second hardness and/or a second melting point which are lower than the first hardness and/or the first melting point, which allows a plurality of semiconductor packages to be easily stacked.

Although a specific embodiment of the present invention has been described for illustrative purposes, those skilled in the art will appreciate that various modifications, additions and substitutions are possible, without departing from the scope and the spirit of the invention as disclosed in the accompanying claims.

What is claimed is:

1. A semiconductor package comprising:
a semiconductor chip having a semiconductor chip body including a circuit unit and a bonding pad disposed on a center portion of the semiconductor chip body to be connected to the circuit unit;
a through-electrode formed through the semiconductor chip between a first surface and a second surface of the semiconductor chip, the through-electrode having a first electrode with a recessed portion formed therein and a second electrode disposed within the recessed portion,
wherein the first and second electrodes each have a semicircular extension portion at the first surface of the semiconductor chip, wherein sides of the second extension portion are curved so that an area of the second electrode at the first surface is greater than an area of the second electrode at the second surface, and wherein the sides of the first extension portion are curved so that a perimeter of the first extension portion at the first surface is greater than a perimeter of the first electrode at the second surface; and
a re-distribution layer formed on a surface of the semiconductor chip body electrically connecting the bonding pad with the through-electrode,
wherein the through-electrode passes through an edge portion of the semiconductor chip body.

2. The semiconductor package according to claim 1, wherein the re-distribution layer has an opening to expose the second electrode.

3. The semiconductor package according to claim 1, wherein first electrode comprises a first metal having a first hardness, and the second electrode comprises a second metal having a second hardness lower than the first hardness.

4. The semiconductor package according to claim 1, wherein the first electrode comprises a first metal having a first melting point, and the second electrode comprises a second metal having a second melting point lower than the first melting point.

5. The semiconductor package according to claim 1, wherein the first electrode comprises any one of copper, aluminum, aluminum alloy, and a metal alloy, and the second electrode comprises a solder.

6. The semiconductor package according to claim 1, wherein the first electrode has a length greater than a thickness of the semiconductor chip body.

7. The semiconductor package according to claim 1, wherein the semiconductor chip further comprises an insulating film formed on the semiconductor chip body to cover the bonding pad, the first electrode and the second electrode.

8. The semiconductor package according to claim 7, wherein the insulating film comprises an opening to expose the second electrode.

9. The semiconductor package according to claim 1, wherein the re-distribution layer further comprises a seed metal pattern.

10. The semiconductor package according to claim 1, wherein a connection pattern containing the same material as that of the first electrode is disposed between the re-distribution layer and the bonding pad.

11. The semiconductor package according to claim 1, wherein the semiconductor chip body further comprises a fuse for repairing the circuit unit and a fuse insulating member for covering the fuse.

12. The semiconductor package according to claim 1, further comprising:
   a substrate having a connection pad;
   a solder layer disposed on the connection pad; and
   an under-fill member interposed between the substrate and the semiconductor chip body,
   wherein the through-electrode is connected to the connection pad via the solder layer.

13. The semiconductor package according to claim 12, further comprising a dummy chip support member interposed between the substrate and the semiconductor chip body to create a stable support for the semiconductor chip body.

14. The semiconductor package according to claim 13, wherein the dummy chip support member comprises any one of a dummy solder ball, a dummy bump, and a closed-loop shaped dummy support member.

* * * * *